(12) United States Patent
Le et al.

(10) Patent No.: US 6,278,333 B1
(45) Date of Patent: Aug. 21, 2001

(54) PHASE LOCK LOOP WITH DUAL STATE CHARGE PUMP AND METHOD OF OPERATING THE SAME

(75) Inventors: Quang C. Le, Gilbert, AZ (US); Ronald H. Deck, Cooper City, FL (US); Richard B. Meador, Gilber, AZ (US); David H. Minasi, Fort Lauderdale, FL (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/514,802

(22) Filed: Feb. 29, 2000

(51) Int. Cl.[7] .................................................. H03L 7/08
(52) U.S. Cl. ........................ 331/17; 331/25; 325/536; 325/157
(58) Field of Search ........................ 331/17, 25; 327/536, 327/157

(56) References Cited

U.S. PATENT DOCUMENTS

| | | |
|---|---|---|
| 4,816,774 | 3/1989 | Martin ................................. 331/1 A |
| 5,055,800 | 10/1991 | Black et al. .......................... 331/1 A |
| 5,055,802 | 10/1991 | Hietala et al. ......................... 331/16 |
| 5,070,310 | 12/1991 | Hietala et al. ....................... 331/1 A |
| 5,093,632 | 3/1992 | Hietala et al. ....................... 331/1 A |
| 5,111,162 | 5/1992 | Hietala et al. ....................... 332/127 |
| 5,592,120 | * 1/1997 | Palmer et al. ..................... 331/17 X |

* cited by examiner

Primary Examiner—Arnold Kinkead
(74) Attorney, Agent, or Firm—Scott M. Garrett

(57) ABSTRACT

A phase lock loop (100) includes a dual-state charge pump (120) having a first current source (220), a second current source (230) coupled in series to the first current source, a third current source (240), a fourth current source (250) coupled in series to the third current source, and control circuitry (210) coupled to the first, second, third, and fourth current sources. The charge pump can be programmed to be in an adapt mode with large up and down currents or in a normal mode with small up and down currents. The duration of the adapt mode can be programmed by a timer. The phase lock loop has a wide loop bandwidth and a faster lock time during the adapt mode and a narrow loop bandwidth and less phase noise during the normal mode.

25 Claims, 5 Drawing Sheets

PHASE LOCK LOOP WITH DUAL STATE CHARGE PUMP AND METHOD OF OPERATING THE SAME

FIELD OF THE INVENTION

This invention relates, in general, to phase lock loops, and more particularly, to dual-state phase lock loops and to methods of reducing lock time for phase lock loops.

BACKGROUND OF THE INVENTION

High speed communication devices require phase lock loops (PLLs) with fast lock times. For example, when operating according to a wireless cellular protocol such as iDEN (integrated digitally enhanced network), the PLL lock time should be on the order of two milliseconds (msec). A PLL typically exhibits an inverse relationship to the closed loop bandwidth of the PLL. Accordingly, to achieve a short PLL lock time, the PLL needs to have a wide loop bandwidth. In addition to the fast lock time specification, the high speed communication devices also have demanding sideband noise requirements to reduce adjacent channel interference. For example, sideband noise in the iDEN wireless cellular protocol cannot be more than 117 decibels (dB) at 25 KiloHertz (KHz) offset from the carrier frequency. Undesired noise generated from a phase detector or a charge pump in the PLL increase the sideband noise. To reduce the sideband noise, the PLL loop bandwidth may be reduced. However, reducing the loop bandwidth of a PLL increases the lock time of the PLL. Therefore, using a larger loop bandwidth in a PLL decreases the lock time of the PLL at the expense of increasing the sideband noise of the PLL. Similarly, using a smaller loop bandwidth in a PLL decreases the sideband noise of the PLL at the expense of increasing the lock time of the PLL. Accordingly, a tradeoff exists between the lock time and the phase noise performance of a PLL.

One solution to avoid this tradeoff uses a first PLL with a large bandwidth and a second PLL with a small bandwidth. However, the use of two PLLs is expensive compared to using a single PLL. Another solution uses a single PLL that uses different loop filters at different times to produce different loop bandwidths are different times. However, switching from one loop filter to another causes an undesirable frequency glitch in the PLL output. Yet another solution uses a single PLL that uses a single loop filter, but changes the resistance value of a variable resistor in the loop filter to produce different loop bandwidths. However changing the resistance value of the variable resistor also causes an undesirable frequency glitch in the PLL output.

Accordingly, a need exists for a PLL and method of operation that reduces the lock time of the PLL when switching from one frequency to another. It is also desirable for he PLL and method of operation to minimize the phase noise in the output signal of the PLL and to minimize frequency glitches in the output signal of the PLL.

BRIEF DESCRIPTION OF THE DRAWINGS

The invention will be better understood from a reading of the following detailed description, taken in conjunction with the accompanying drawing figures in which.

Figure 1:
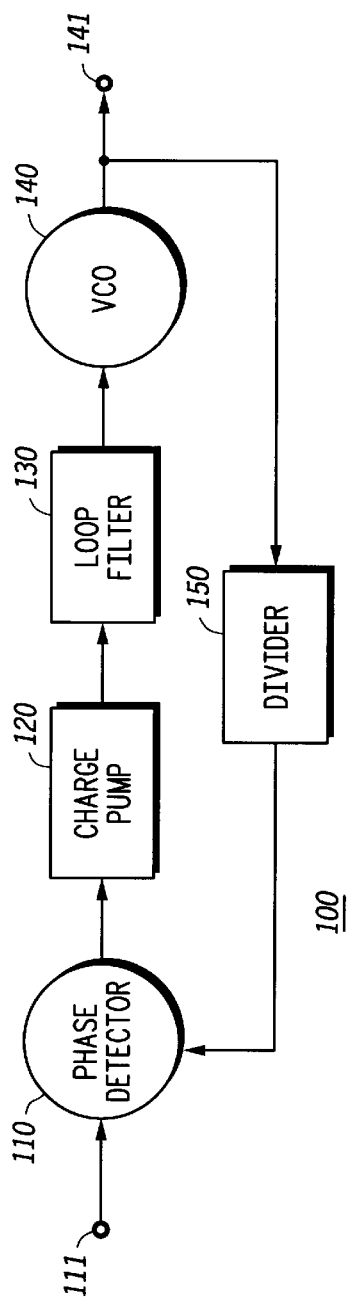
FIG. 1 illustrates block diagram of a phase lock loop in accordance with an embodiment of the invention.

For simplicity and clarity of illustration, the elements in the drawing figures are not necessarily drawn to scale, and the same reference numerals in different figures denote the same elements. Furthermore, descriptions and details of well-known features and techniques are omitted to avoid unnecessarily obscuring the invention.

DETAILED DESCRIPTION OF THE DRAWINGS

FIG. 1 illustrates block diagram of a PLL 100. In the preferred embodiment, PLL 100 is used in a cellular telephone that transmits and receives signals according to the Integrated Digitally Enhanced Network (IDEN) wireless protocol. Also in the preferred embodiment, PLL 100 operates a fractional N synthesizer, as known in the art. PLL 100 comprises a phase detector 110, a charge pump 120 coupled to the output of phase detector 110, and a loop filter 130 coupled to the output of charge pump 120. In the preferred embodiment, PLL 100 comprises a single phase detector, a single charge pump, and a single loop filter. PLL 100 also comprises a voltage-controlled oscillator (VCO) 140 coupled to the output of loop filter 130, and PLL 100 further comprises a divider 150 coupled to the output of VCO 140 and to an input of phase detector 110. PLL 100 transmits an output at a node 141. In the preferred embodiment, divider 150 divides the frequency received from VCO 140 over a approximate range of twenty to seventy.

The output of VCO 140 is the output of PLL 100 and is also an input for divider 150. Divider 150 can be a multi-accumulator, fractional N divider and can use automatic frequency control techniques. Phase detector 110 receives two input signals: a reference frequency signal and a feedback frequency signal. Phase detector 110 receives the reference frequency from a node 111. Divider 150 transmits the feedback frequency, and phase detector 110 receives the feedback frequency from divider 150. Phase detector 110 is a dual-state phase detector preferably comprising two re-setable D-Q flip-flops and a reset delay circuit. Dual-state phase detectors typically achieve phase lock at a phase difference of one-hundred eighty degrees. However, in the preferred embodiment, phase detector 110 locks at a phase difference of approximately two-hundred forty degrees between a phase of the reference frequency and a phase of the feedback frequency. The purpose of this unconventional phase lock difference is described later.

Figure 2:
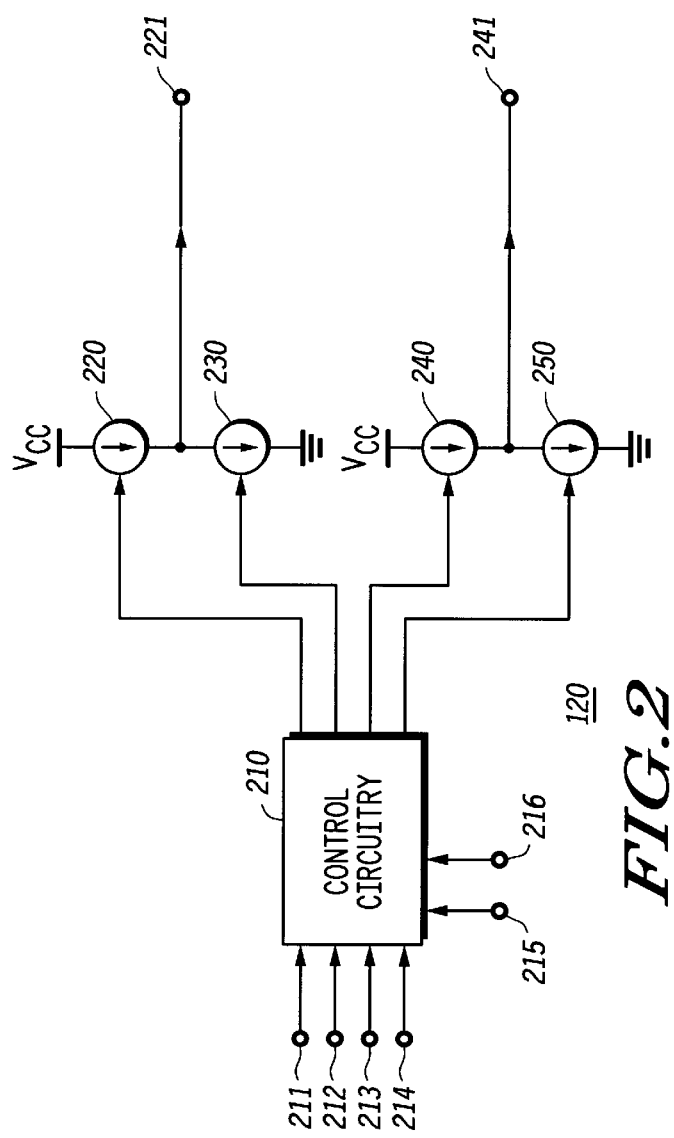
FIG. 2 illustrates a block diagram of a charge pump in the phase lock loop of FIG. 1 in accordance with an embodiment of the invention.

FIG. 2 illustrates a block diagram of charge pump 120 in PLL 100 of FIG. 1. Charge pump 120 comprises a first current source 220, a second current source 230 coupled in series to first current source 220, a third current source 240, and a fourth current source 250 coupled in series to third current source 240. Charge pump 120 also comprises control logic or control circuitry 210 coupled to each of current sources 220, 230, 240, and 250. Control circuitry 210 receives a plurality of input signals via nodes 211, 212, 213, 214, 215, and 216. Nodes 211 and 212 are coupled to phase detector 110 (FIG. 1), and nodes 213, 214, 215, and 216 are coupled other control circuitry that can be located external to PLL 100 (FIG. 1).

Current source 220 provides the up or source current to loop filter 130 at node 221, and current source 230 provides the down or sink current to loop filter 130 at node 221. Current source 240 provides the up or source current to loop filter 130 at node 241, and current source 250 provides the down or sink current to loop filter 130 at node 241. Accordingly, current sources 220 and 240 are individually referred to as up current sources, and current sources 230 and 250 are individually referred to as down current sources. Current sources 220 and 230 are coupled to node 221 and are collectively referred to as a first set of current sources or the normal or non-adapt current sources. Current sources 240 and 250 are coupled to node 241 and are collectively referred to as a second set of current sources or the adapt current sources.

Loop filter 130 receives the normal current sources at node 221 and receives the adapt current sources at node 241. The adapt current sources at node 241 are on during the adapt mode, and the normal current sources at node 221 are on during the normal mode. When the adapt current sources are on, the normal current sources are off, and when the normal current sources are on, the adapt current sources are off. The duration of the adapt mode is set by a programmable adapt timer.

During the adapt mode, the adapt current sources are on and are coupled to loop filter 130 via node 241. This adapt mode configuration of PLL 100 provides a wide PLL loop bandwidth such as, for example, 20 KHz. For PLL 100, the loop filter bandwidth is set by the charge pump gain (Kd), the VCO gain (Kv), divider ration (N), and the loop filter transfer response (H(s)). The wide PLL loop bandwidth is chosen to be 20 KHz based on a 2 msec lock time set by the IDEN wireless protocol and also based on how the phase lock is achieved. After a pull-in time of approximately 300 microseconds, the PLL typically locks within 0.01 percent (%) of the phase of the reference frequency after about ten times a constant, where the constant is the inverse of the loop bandwidth. With a loop bandwidth of 20 KHz, the pull-in time plus the lock time is approximately 0.8 msec, which leaves a margin of about 1.2 msec for the PLL to lock in the adapt mode before the PLL switches over to the normal mode.

During the normal mode, the normal current sources are on and are coupled to loop filter 130 via node 221. This normal mode configuration of PLL 100 provides a narrow PLL loop bandwidth such as, for example, 2 KHz. Based on system simulations and empirical data, the narrow loop bandwidth is preferred to be less than about 2 KHz so that the PLL can meet the iDEN sideband noise specifications. Accordingly, the wide loop bandwidth can be larger than the narrow loop bandwidth by a factor of at least ten.

Charge pump 120 is a dual-state charge pump. A dual-state charge pump is preferred in this embodiment of PLL 100 because of the high linearity performance of the dual-state charge pump. One characteristic of a dual-state charge pump is that the up current remains on. Therefore, in charge pump 120, up current source 220 remains on while PLL 100 operates in the normal mode and has a narrow loop bandwidth, and up current source 240 remains on while PLL 100 operates in the adapt mode and has a wide loop bandwidth. Another characteristic of a dual-state charge pump is that the down current is on during a down pulse. In PLL 100, the down pulse is a differential voltage signal generated by phase detector 110 (FIG. 1) and appearing at nodes 211 and 212 of charge pump 120. Accordingly, in charge pump 120, down current source 230 is on in the normal mode during a down pulse, and down current source 250 is on in the adapt mode during a down pulse.

The operation of charge pump 120 is explained briefly and in general terms with reference to FIGS. 1 and 2. Phase detector 110 receives and compares the phase difference of the reference and feedback signals. Based on the results of the comparison, phase detector 110 generates a higher or lower rate of down pulses, and down current sources 230 and 250 are indirectly controlled by the down pulses generated by phase detector 110. Phase detector 110 does not generate an up pulse because of the dual-state nature of charge pump 120 where up current sources 220 or 240 remain on during depending on whether PLL 100 operates in the normal or adapt modes. Accordingly, phase detector 110 does not need to generate any up pulses to turn on up current sources 220 or 240 because up current sources 220 or 240 remain on during their respective modes.

Figure 3:
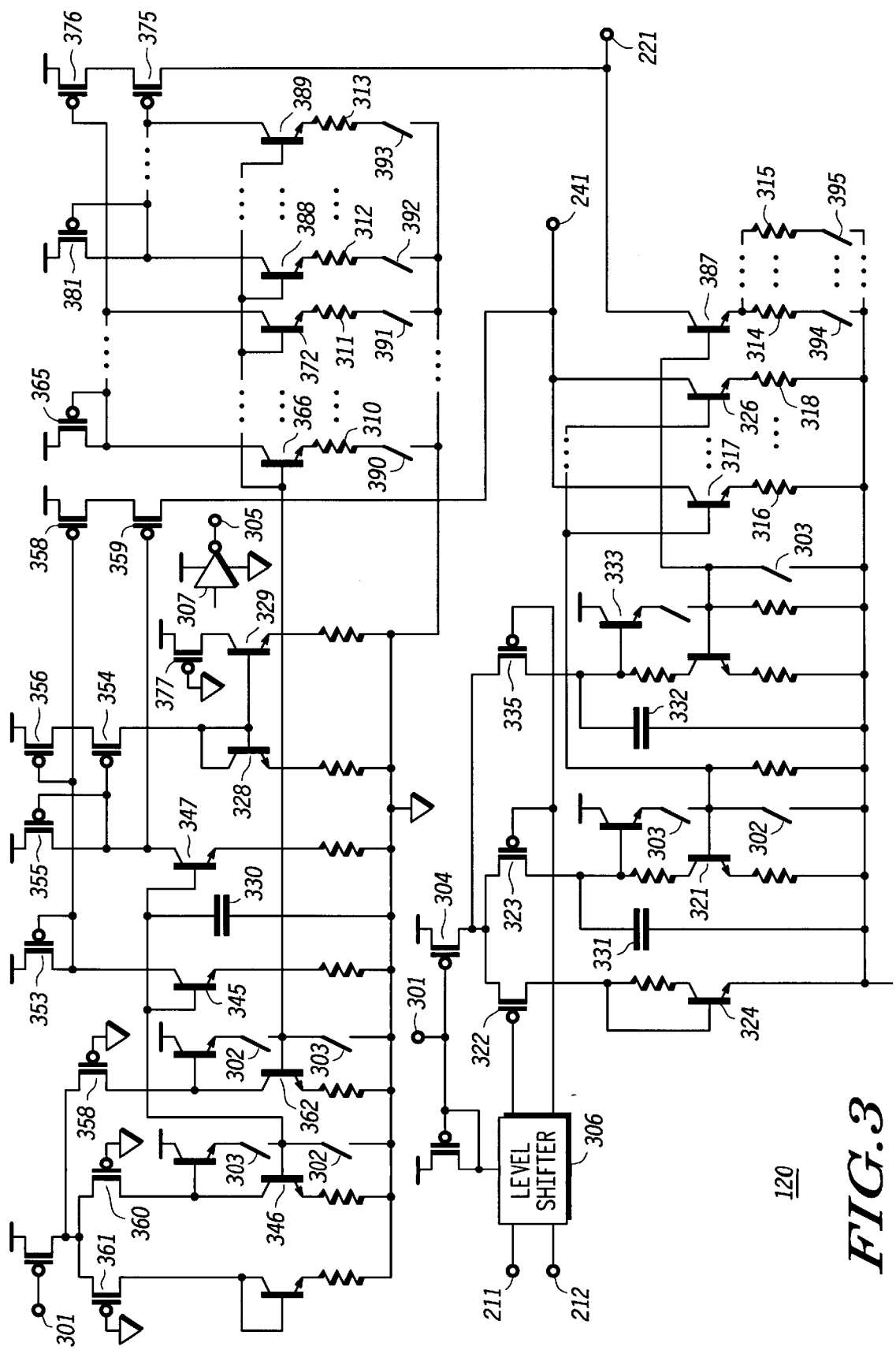
FIG. 3 illustrates a simplified circuit diagram of the charge pump of FIG. 2 in accordance with an embodiment of the invention.

If the reference frequency is smaller than the feedback frequency, phase detector 110 generates a high rate of down pulses, each of which are converted into a differential voltage. The differential voltages are applied to nodes 211 and 212 of the dual-state charge pump 120 (FIG. 3). In response to each of the down pulses, either down current source 230 or down current source 250 is turned on depending on whether PLL 100 operates in the normal or adapt modes. If PLL 100 is in the adapt mode, a net current would flow out of loop filter 130 from node 241 because the magnitude of down current source 250 is greater than the magnitude of up current source 240 and because down current source 250 is on frequently. If PLL 100 is in the normal mode, a net current would flow out of loop filter 130 from node 221 because the magnitude of down current source 230 is greater than the magnitude of up current source 220 and because down current source 230 is on frequently. This outflow of current from loop filter 130 causes the output voltage of loop filter 130 to decrease, which causes the output frequency of VCO 140 to decrease. The result is that PLL 100 is steering down in frequency until the reference and the feedback frequencies are locked in phase at a phase difference of approximately two-hundred forty degrees. In the adapt mode, the reference and the feedback frequencies may not be locked in phase until after PLL 100 switches out of the adapt mode and into the normal mode because the duration of the adapt mode is controlled by an external adapt timer.

In summary, to decrease the output frequency of VCO 140, the input control voltage for VCO 140 needs to be decreased. To decrease the control voltage in the normal mode, down current source 230 is on more frequently while up current source 220 remains on continuously. To decrease the control voltage in the adapt mode, down current source 250 is on more frequently while up current source 240 remains on continuously. If the down current sources are larger than the up current sources in both modes, the net effect over time is a flow of current out of loop filter 130. This reversal in current decreases the output voltage of loop filter 130, and the decrease in the output of voltage of loop filter 130 decreases the output frequency of VCO 140.

On the other hand, if the reference frequency is greater than the feedback frequency, phase detector 110 generates a lower rate of down pulses than if the reference frequency were less than the feedback frequency. The down pulses are converted into differential voltages. The differential voltages are applied to nodes 211 and 212 of the dual-state charge pump 120 (FIG. 3). In response to each of the down pulses, either down current source 230 or down current source 250 is turned on depending on whether PLL 100 operates in the normal or adapt modes. If PLL 100 is in the adapt mode, a net current would flow into loop filter 130 from node 241 because down current source 250 is on infrequently even though the magnitude of down current source 250 is greater than the magnitude of up current source 240. If PLL 100 is in the normal mode, a net current would flow into loop filter 130 from node 221 because down current source 230 is on frequently even though the magnitude of down current source 230 is greater than the magnitude of up current source 220. This inflow of current into loop filter 130 causes the output voltage of loop filter 130 to increase, which causes the output frequency of VCO 140 to increase. The result is that PLL 100 is steering up in frequency until the reference and the feedback frequencies are locked in phase at a phase difference of approximately two-hundred forty degrees. In the adapt mode, the reference and the feedback frequencies may not be locked in phase until after PLL 100 switches out of the adapt mode and into the normal mode because the duration of the adapt mode is controlled by an external adapt timer.

In summary, to increase the output frequency of VCO 140, the input control voltage for VCO 140 needs to be increased. To increase the control voltage in the normal mode, down current source 230 is on infrequently while up current source 220 remains on continuously. To increase the control voltage in the adapt mode, down current source 250 is on infrequently while up current source 240 remains on continuously. Even if the magnitudes of down current sources 230 and 250 are larger than that of up current sources 220 and 240, respectively, the net effect over time in both the adapt and normal modes is an increase in current, or more up current than down current, going into loop filter 130. This increase in current increases the output voltage of loop filter 130, and the increase in the output of voltage of loop filter 130 increases the output frequency of VCO 140.

The current gain of up current source 240 is greater than the up current gain of 220 current source, preferably by a factor of at least fifty. Similarly, the current gain of down current source 250 is greater than the current gain of down current source 230, again, preferably by a factor of at least fifty. Accordingly, the first set of current sources or the normal mode current sources, current sources 220 and 230, output smaller currents than the second set of current sources or adapt mode current sources, current sources 240 and 250. Thus, during the normal mode, charge pump 120 supplies small currents to loop filter 130, and during the adapt mode, charge pump 120 supplies large currents to loop filter 130. The current of charge pump 120 is larger during the adapt mode than in the normal mode to make the loop bandwidth larger in the adapt mode than in the normal mode.

Adapt current sources 240 ark 250 have fixed values. However, normal current sources 220 and 230 can be programmed by four different values. These different values give charge pump 120 different gain settings and thus allow the PLL loop bandwidth to be optimized for other factors such as, for example, lower sideband noise or phase noise in addition to reducing the PLL lock time in the iDEN mode.

The magnitude of the current from current source 230 divided by the magnitude of the current from current source 220 approximately equals a predetermined number, and the magnitude of the current from current source 250 divided by the magnitude of the current from current source 240 approximately equals the same predetermined number. The ratio of the down current to the up current for the first set of current sources is set to be equal to the ratio of the down current to the up current for the second set of current sources to prevent a frequency glitch and/or a phase shift in the output signal of PLL 100 (FIG. 1) when switching from the first set of current sources to the second set of current sources or vice versa. In the preferred embodiment, the predetermined number is approximately 3.2 to optimize the tradeoff between the lock time of PLL 100 and the sideband noise in the output of PLL 100 while minimizing the probability of losing lock when smoothly switching from the adapt mode to the normal mode or vice versa.

Control circuitry 210 in charge pump 120 comprises a delay circuit or a current sensor circuit to measure the magnitude of the current from current sources 240 and 250. The sensor circuit is used during the transition from using the second set of current sources to using the first set of current sources or from the adapt mode to the normal mode. Control circuitry 210 turns on the first set of current sources preferably only after the sensor circuit measures the magnitude of the current from adapt current sources 240 and 250 to be below a predetermined or threshold level. Typically, the adapt current must be smaller than a few tens of nanoAmperes before control circuitry 210 allows the normal current sources to turn on. This ensures that both adapt current sources 240 and 250 are shut off before normal current sources 220 and 230 can turn on. This is done so that the switching from adapt to normal mode would not cause any current or voltage glitches resulting in a frequency glitch. This frequency glitch may increase the PLL lock time beyond an acceptable lock time, or the frequency glitch may even prevent the PLL from locking.

FIG. 3 illustrates a circuit diagram of charge pump 120. The circuit diagram of FIG. 1 is simplified so as not to obscure the invention. For example, the biasing portion, among other portions, of charge pump 120 is omitted from the illustration of charge pump 120 in FIG. 3. The biasing portion of charge pump 120 is coupled to nodes 301 in FIG. 3 for current matching.

The top half of FIG. 3 represents up current sources 220 and 240 (FIG. 2) and its associated control circuitry in charge pump 120, and the bottom half of FIG. 3 represents down current sources 230 and 250 (FIG. 2) and their associated control circuitry in charge pump 120. PMOS transistor 377, NPN bipolar transistors 328 and 329, and an inverter 307 in the top half of FIG. 3 represent the current sensor circuit in charge pump 120 that measures the magnitude of current from the adapt mode current sources. This current sensor circuit has an output at a node 305.

As illustrated in FIG. 3, charge pump 120 comprises, among other features, a plurality of NPN bipolar transistors, a plurality of p-type metal oxide semiconductor (PMOS) transistors, a plurality of resistors, a plurality of capacitors, and a plurality of current gain switches. As an example, the switches can be comprised of n-type metal oxide semiconductor (NMOS) transistors. Normal mode switches 302 are closed during the normal mode and open during the adapt mode. Adapt mode switches 303 are closed during the adapt mode and open during the normal mode. The opening and closing of switches 302 and 303 are controlled by normal and adapt mode signals from nodes 213 (FIG. 2) and 214 (FIG. 2), respectively. The output of the current sensor circuit at node 305 is used in combination with the normal mode signal from node 213 (FIG. 2) to determine when to close normal mode switches 302.

The operation of the up current sources in the top half of FIG. 3 is described first. PMOS transistors 361, 360, and 358 drive NPN bipolar transistors 346 and 362. During the adapt mode, switches 303 are closed, and switches 302 are open. Accordingly, during the adapt mode, transistor 346 is on and transistor 362 is off. Transistor 346 generates a reference current that drives NPN bipolar transistors 345 and 347, and transistors 345 and 347 generate reference currents that drive PMOS transistors 353 and 355, respectively. These NPN bipolar transistors and PMOS transistors form a current mirror with a high output resistance. Transistors 353 and 355 generate currents that are mirrored to the cascoded stack of PMOS transistors 358 and 359. Transistors 358 and 359 generate the adapt mode up current, which is preferably about four milliAmperes (mA). Transistors 358 and 359 are cascoded and preferably have long channel lengths to maintain a substantially constant charge pump current from 0.5 volts (V) to 4.5 V.

When the adapt mode ends, the current sensor circuit senses when the adapt current transistors 358 and 359 is very small or a few tens of nanoAmperes. Accordingly, the current sensor circuit generates control signals that allow switches 303 to be opened and that close switches 302. Accordingly, transistor 346 is turned off, and transistor 362 is turner on. Switching capacitor 330 minimizes the voltage glitch when transistor 346 is turned off. The current sensing circuit and the predetermined ratios between the down and up currents of the normal and adapt modes also assist in minimizing the voltage glitch to smoothly switch from the adapt mode to the normal mode or vice versa During the normal mode, transistor 362 is turned on and generates a reference current that drives NPN bipolar transistors 366, 372, 388, and/or 389. Transistors 366, 372, 388, and/or 389 generate reference currents that drive PMOS transistors 365 and 381. Transistors 365 and 381 generate currents that are mirrored to the cascoded stack of PMOS transistors 376 and 375. Transistors 376 and 375 generate the normal mode up current. Transistors 376 and 375 are cascoded and preferably have long channel lengths to maintain a substantially constant charge pump current from 0.5 volts (V) to 4.5 V.

The magnitude of the currents generated by transistors 365 and 381 depends on which of transistors 366, 372, 388, and 389 are on to drive transistors 365 and 381. Switches 390, 391, 392, and 393 determine which of transistors 366, 372, 388, and 389 are on. The voltages at nodes 215 and 216 (FIG. 2) determine which of switches 390, 391, 392, and 393 are open or closed. If switches 390 and 392 are closed, transistors 366 and 388 are on, and charge pump 120 generates a first normal mode up current. However, if switches 391 and 393 are closed, transistors 372 and 389 are on, and charge pump 120 generates a second normal mode up current. In the preferred embodiment, the second normal mode up current that is larger than the first normal mode up current.

In the preferred embodiment, the following components are identical with each other to match or balance circuit parasitics: transistors 366 and 388, transistors 372 and 389, and resistors 310 and 312, resistors 311 and 313. Furthermore, switches 390 and 392 are preferably closed together, and switches 391 and 393 are preferably closed together. Switches 390 and 392 are preferably not closed simultaneously with switches 391 and 393, and vice versa. Further, additional sets of bipolar transistors, resistors, and switches can be inserted into charge pump 120 at the ellipses in the top half of FIG. 3. In the preferred embodiment, four sets are added, where the first two sets are identical to each other and where the second two sets are identical to each other. A first one of the first two sets and a first one of the second two sets are added at the first set of ellipses in the top half of FIG. 3 to form two additional current branches, and a second one of the first two sets and a second one of the second two sets are added at the second set of ellipses in the top half of FIG. 3 to form two more additional current branches. Accordingly, when the normal mode up current source is on, the normal mode up current can have four different magnitudes, which are preferably 50, 100, 200, and 400 microAmperes (uA).

Next, the operation of the down current sources in the bottom half of FIG. 3 is described. Nodes 211 and 212 are coupled to phase detector 110 (FIG. 1). The differential voltage between nodes 211 and 212 determines if the down current sources are on or off. The differential voltage at nodes 211 and 212 is preferably 2.1 V and 2.4 V or vice versa. These voltages are coupled to a level shifter 306, which shifts or adjusts the voltages at nodes 211 and 212 to a voltage level of either 2.7 V or 3.5 V applied to the gate of PMOS transistor 322 and applied to the gates of PMOS transistors 323 and 325. Transistor 322 and transistors 323 and 325 are coupled together in a differential configuration.

If the feedback frequency is less than the reference frequency, then the voltage at node 212 is greater than the voltage at node 211. In this embodiment, the voltage at node 211 is preferably 2.1 V, and the voltage at node 212 is preferably 2.4 V. Accordingly, transistor 322 has 2.7 V at its gate and is turned on, and transistors 323 and 335 have 3.5 V at each of their gates and are turned off. When PMOS transistors 323 and 335 are turned off, the down current sources in both the normal and adapt modes are turned off.

However, if the feedback frequency is greater than the reference frequency, then the voltage at node 211 is greater than the voltage at node 212. In this embodiment, the voltage at node 211 is preferably 2.4 V, and the voltage at node 212 is preferably 2.1 V. Accordingly, transistor 322 has 3.5 V at its gate and is turned off, and transistors 323 and 335 each have 3.5 V at each of their gates. One of transistors 323 and 335 will be on depending whether PLL 100 is in the adapt or normal mode. In the adapt mode, transistor 323 would be on, and in the normal mode, transistor 335 would be on.

As indicated earlier, during the adapt mode, switches 303 are closed, and switches 302 are open. Accordingly, in the adapt mode, an NPN transistor 321 is on, and an NPN transistor 333 is off. Transistor 323 conducts the current generated by the bias current transistor 304 and turns on NPN transistor 321. Transistor 321 generates a reference current that is mirrored by NPN transistors 317 and 326. In the preferred embodiment, transistors 317 and 326 are identical to each other, and resistors 316 and 318 are also identical to each other. In the preferred embodiment, transistors 317 and 326 are identical to each other, and resistors 316 and 318 are also identical to each other such that transistors 317 and 326 each carry about 3.2 mA of current. Transistors 317 and 326 and resistors 316 and 318 are preferably each duplicated at the ellipses located between these components to form two additional current branches. With the addition of the two current branches between transistors 317 and 326, the total current from these four parallel branches is about 12.8 mA of current.

When the adapt mode ends, switches 303 are opened, and switches 302 are closed. Accordingly, transistor 321 is turned off, and transistor 333 is turned on. Switching capacitors 331 and 332 minimize the voltage glitch when transistors 321 and 333 are turned off and on when switching from the adapt mode to the normal mode and vice versa.

During the normal mode, transistor 333 is turned on and generates a reference current that is mirrored by transistor 387. The magnitude of the normal mode down current depends on which of switches 394 and 395 are closed. The voltages at nodes 215 and 216 (FIG. 2) determine which of switches 394 and 395 are open or closed. If switch 394 is closed, charge pump 120 generates a first normal mode down current. However, if switch 395 is closed, charge pump 120 generates a second normal mode down current. In the preferred embodiment, the second normal mode down current is larger than the first normal mode down current. To provide matching current ratios between the adapt mode up and down currents and the normal mode up and down currents, switch 394 in the normal mode down current source is closed when switches 390 and 392 in the normal mode up current source are closed. Similarly, switch 395 in the normal mode down current source is closed when switches 391 and 393 in the normal mode up current source are closed. Switches 394 and 395 are preferably not closed simultaneously.

Additional sets of resistors and switches can be inserted into charge pump 120 at the ellipses in the bottom half of FIG. 3 between resistors 314 and 315 and switches 394 and 395. In the preferred embodiment, two sets are added to form two additional parallel current branches. Accordingly, when the normal mode down current source is on, the normal mode down current can have four different magnitudes, which are preferably about 160 uA, 320 uA, 640 uA, and 1.28 mA.

Figure 4:
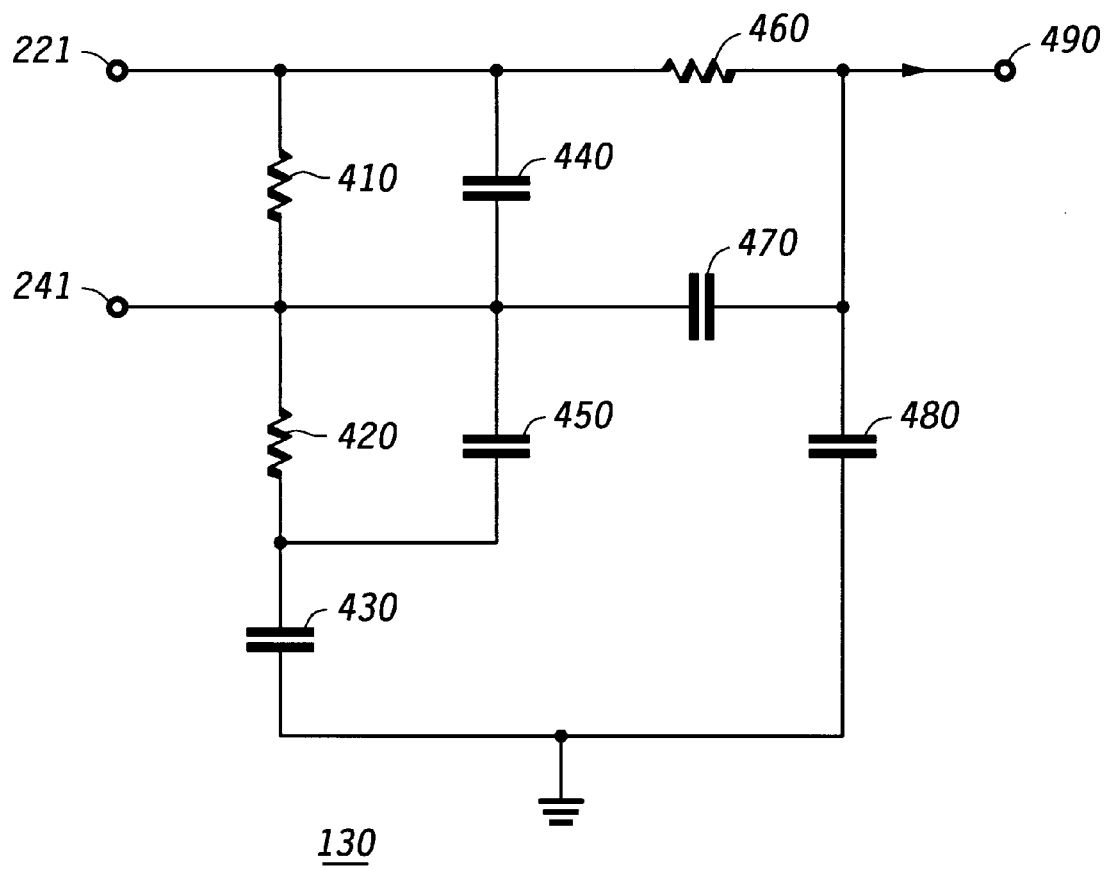
FIG. 4 illustrates a circuit diagram of a loop filter in the phase lock loop of FIG. 1 in accordance with an embodiment of the invention.

FIG. 4 illustrates a circuit diagram of loop filter 130 in PLL 100 (FIG. 1).

Loop filter 130 includes resistors 410, 420, and 460 and also includes capacitors 430, 440, 450, 470, and 480. When charge pump 120 (FIGS. 1, 2, and 3) operates in adapt mode, loop filter 130 receives current from both current sources 240 and 250 via node 241. In this case, PLL 100 is configured with the high bandwidth, preferably about 20 KHz. When charge pump 120 operates in the normal mode, loop filter 130 receives current from both current sources 220 and 230 via node 221. In this case, PLL 100 is configured with the narrow bandwidth, preferably about 2 KHz.

As an example, the reference frequency may be a single frequency such as 16.8 MHz. The frequency at the output of VCO 140 is the fractional N divide ration times this 16.8 MHz reference frequency. Depending on the desired output frequency for VCO 140, a new divider ratio is programmed into divider 150, and PLL 100 attempts to lock the predetermined phase difference between the reference frequency and the divided down frequency of the output signal from VCO 140. For the iDEN wireless cellular protocol, the PLL loop bandwidth must be smaller than about 3 kHz to meet the stringent sideband noise requirement of approximately −117 dB at 25 kHz offset from the carrier frequency. However, with a loop bandwidth of only 3 kHz, it would take more than about 4 msec for the PLL to lock in to a new frequency. PLL 100 solves the problem mentioned here by using a charge pump having normal and adapt modes. That is, first PLL 100 is configured with a high bandwidth, preferably 20 KHz. This is accomplished using charge pump 120 in the adapt mode with its large adapt up and down current sources. The duration of the adapt mode is determined by an adapt timer that is programmable from approximately 0 to 2 msec. After the adapt mode, the output synthesized frequency of PLL 100 will be close to the desired frequency, and PLL 100 enters the normal, or non-adapt, mode with charge pump 120 operating with the lower normal up and down current sources, which lower the PLL loop bandwidth to about 2 kHz. Because the PLL output frequency is close to the final desired frequency, a narrower loop bandwidth is sufficient to guarantee final lock for the PLL. In addition, the narrow loop bandwidth reduces the amount of sideband noise at the output of the PLL.

In the preferred embodiment, the second bandwidth is greater than the first bandwidth by a factor of at least ten. For example, the first bandwidth can be approximately 1.5 to 2 kilohertz (kHz), and the second bandwidth can be approximately 15 to 20 kHz.

Figure 5:
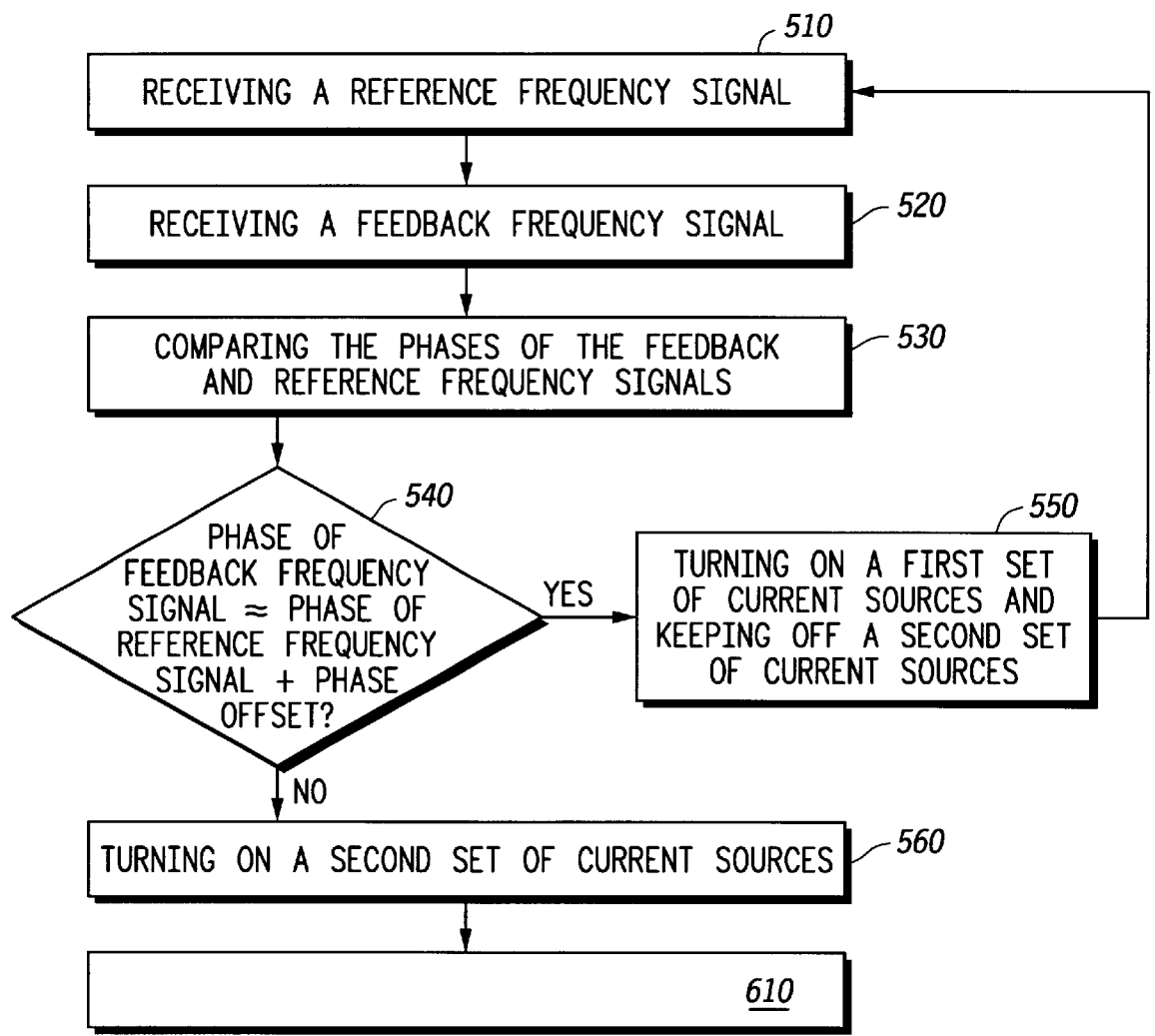
FIGS. 5 and 6 illustrate a flow chart of a method of operating the phase lock loop of FIG. 1 in accordance with an embodiment of the invention.
Figure 6:
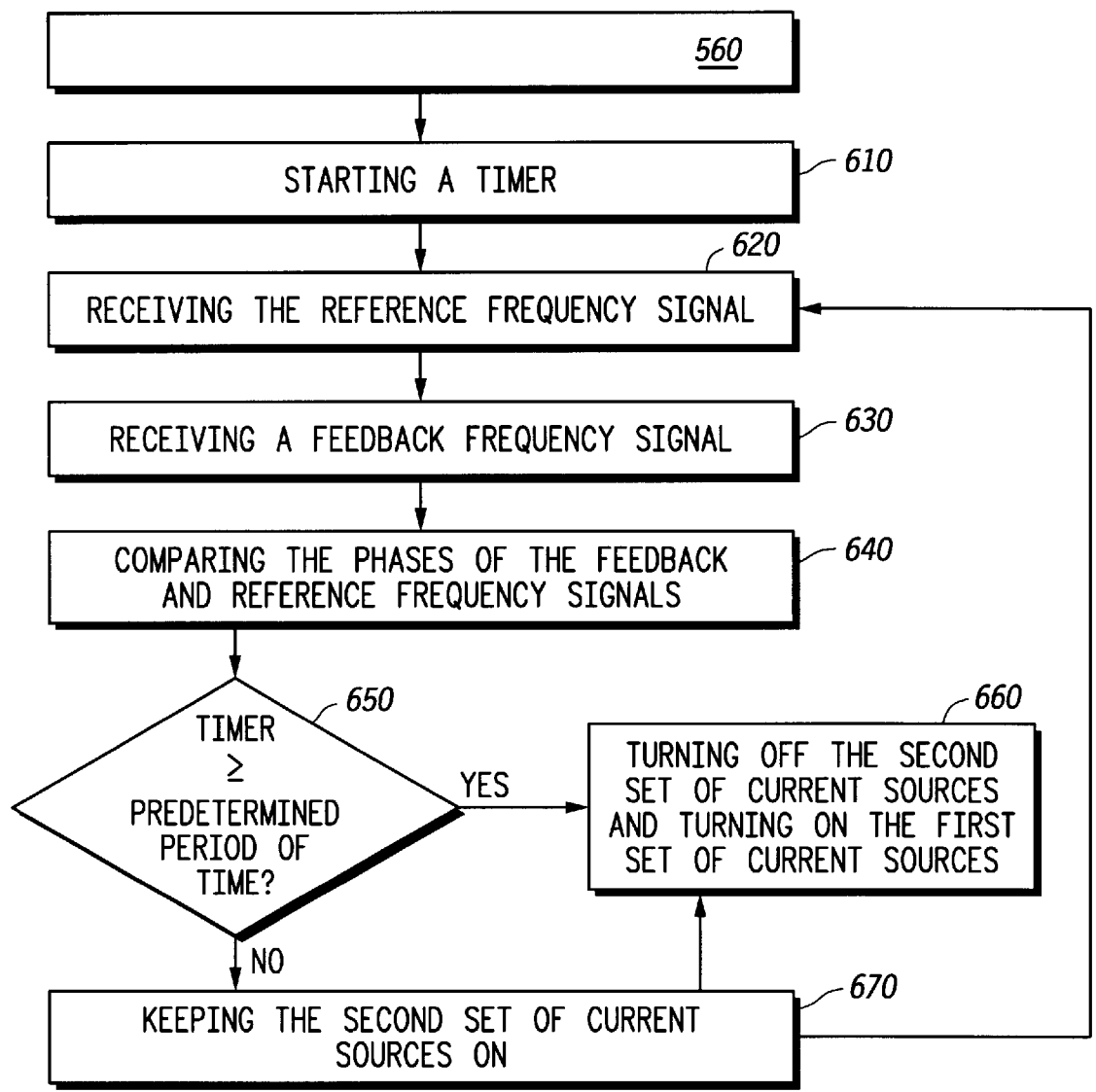

FIGS. 5 and 6 illustrate a flow chart of a method 500 of operating PLL 100 in FIG. 1. Method 500 reduces the lock time for PLL 100 while simultaneously keeping the phase noise for PLL 100 low and minimizing frequency glitches in the output of PLL 100. At a step 510 of method 500, a phase detector of a PLL receives a reference frequency signal from a frequency generation circuit, and at a step 520 of method 500, the phase detector receives a feedback frequency signal from a divider in the PLL. It is understood that the sequence of steps 510 and 520 can be reversed, or steps 510 and 520 can be performed simultaneously.

At a step 530 of method 500, the phase detector compares the phases of the feedback and reference frequency signals. Preferably, the feedback frequency signal is compared to the reference frequency signal. At a step 540, a determination is made as to whether a phase of the feedback frequency signal is within a predetermined range of the phase of the reference frequency signal plus a predetermined phase offset. If the answer to the question is yes, then at a step 550, a first set of current sources in a charge pump in the PLL is turned on to either transmit current to a loop filter in the PLL or draw current from the loop filter. Step 550 represents the normal mode described earlier with reference to FIGS. 2 and 3 where the second set of current sources remains off. After step 550, step 510 is repeated. However, if the answer to the question is no, then at a step 560, a second set of current sources in the charge pump is turned on to either transmit current to the loop filter or draw current from the loop filter. Step 560 represents the adapt mode described earlier with reference to FIGS. 2 and 3 where the first set of current sources remains off.

Turning to FIG. 6, method 500 continues at a step 610 where a programmable timer is started, initiated, or reset. Next, at a step 620, the phase detector receives the reference frequency signal from the frequency generation circuit, and at a step 630, the phase detector receives another feedback frequency signal from the divider. At a step 640, the phase detector compares the phases of the feedback and reference frequency signals.

Subsequently, at a step 650, a determination is made as to whether the time tracked by the timer equals or exceeds a predetermined period of time programmed into the timer. In the preferred embodiment, the predetermined period of time is approximately 2 msec. If the answer to the question is yes, then at a step 660, the second set of current sources in the charge pump is turned off, and the first set of current sources in the charge pump is turned on. Step 660 represents the normal mode described earlier with reference to FIGS. 2 and 3. Before performing step 660, the adapt mode current should be near zero or a few tens of nanoAmperes. However, if the answer to the question is no, then at a step 670, the second set of current sources in the charge pump remain on, and the first set of current sources in the charge pump remain off. Step 670 represents the adapt mode described earlier with reference to FIGS. 2 and 3. After step 670, step 620 is repeated. Accordingly, the charge pump will terminate the adapt mode and smoothly switch to the normal mode after the predetermined period of time expires.

Therefore, an improved PLL and method of operation is provided to overcome the disadvantages of the prior art. The PLL and method of operation reduces the lock time of the PLL and also reduces the phase noise in the output of the PLL while minimizing frequency glitches in the PLL output.

Although the invention has been described with reference to specific embodiments, it will be understood by those skilled in the art that various changes may be made without departing from the spirit or scope of the invention. For instance, the numerous details set forth herein such as, for example, the specific number of gain switches and the values of the currents are provided to facilitate the understanding of the invention and are not provided to limit the scope of the invention. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A phase lock loop (PLL) comprising:
   a phase detector;
   a charge pump coupled to the phase detector, the charge pump comprising:
   a first current source;
   a second current source coupled in series to the first current source;
   a third current source;
   a fourth current source coupled in series to the third current source;
   control circuitry coupled to the first, second, third, and fourth current sources;
   a sensor circuit to measure a magnitude of a current of the third current source; and
   the charge pump turns on a first set of current sources comprised of the first and second current sources after the sensor circuit measures the magnitude of the current of the third current source to be below a predetermined level
   a loop filter coupled to the charge pump;
   an oscillator coupled to the loop filter; and
   a divider coupled to the oscillator and the phase detector, wherein:
   the first and second current sources are in parallel with the third and fourth current sources.

2. The PLL of claim 1 wherein:
   a gain of the second current source is greater than a gain of the first current source;
   a gain of the fourth current source is greater than a gain of the third current source;
   the gain of the fourth current source is greater than the gain of the second current source; and
   the gain of the third current source is greater than the gain of the first current source.

3. The PLL of claim 2 wherein:
   the first and second current sources are off when the third current source is on; and
   the third and fourth current sources are off when the first current source is on.

4. The PLL of claim 3 wherein:
   the loop filter has a first bandwidth when the firs current source is on; and
   the loop filter has a second bandwidth greater than the first bandwidth when the third current source is on.

5. The PLL of claim 4 wherein:
   the first and second current sources are coupled together by a first node coupled to a first portion of the loop filter; and
   the third and fourth current sources are coupled together by a second node coupled to a second portion of the loop filter.

6. The PLL of claim 1 wherein:
   a magnitude of a current from the second current source divided by a magnitude of a current from the first current source approximately equals a predetermined number;
   a magnitude of a current from the fourth current source divided by a magnitude of a current from the third current source approximately equals the predetermined number.

7. The PLL of claim 1 wherein:
   a magnitude of a current from the first current source is variable when the first current source is on; and
   a magnitude of a current from the second current source is variable when the second current source is on.

8. The PLL of claim 1 wherein:
   a magnitude of a current from the third current source is constant when the third current source is on; and
   a magnitude of a current from the fourth current source is constant when the fourth current source is on.

9. A phase lock loop (PLL) comprising:
   a phase detector to receive a reference frequency and to receive a feedback frequency;
   a dual-state charge pump coupled to the phase detector;
   a loop filter coupled to the dual-state charge pump;
   a voltage-controlled oscillator coupled to the loop filter; and
   a divider to transmit the feedback frequency to the phase detector, the divider coupled to the voltage-controlled oscillator and the phase detector,
   wherein:
   the dual-state charge pump comprises:
   a first current source;
   a second current source coupled in series to the first current source;
   a third current source;
   a fourth current source coupled in series to the third current source;
   control circuitry coupled to the first, second, third, and fourth current sources; and
   a PMOS current source mirror coupled to the first, second, third, and fourth current sources;
   the first and second current sources are in parallel with the third and fourth current sources;
   a node coupling together the first and second current sources is coupled to a first portion of the loop filter; and
   a node coupling together the third and fourth current sources is coupled to a second portion of the loop filter.

10. The PLL of claim 9 wherein:
    a gain of the second current source is greater than a gain of the first current source by a factor of at least three;
    a gain of the fourth current source is greater than a gain of the third current source by a factor of at least three;
    the gain of the fourth current source is greater than the gain of the second current source by a factor of at least fifty; and
    the gain of the third current source is greater than the gain of the first current source by a factor of at least fifty.

11. The PLL of claim 10 wherein:
    the first and second current sources are off when the third current source is on; and the third and fourth current sources are off when the first current source is on.

12. The PLL of claim 11 wherein:

the dual-state charge pump switches from the third and fourth current sources to the first and second current sources at an end of a predetermined period of time.

13. The PLL of claim 12 wherein:

the loop filter has a first bandwidth when the first and second current sources are on; and the loop filter has a second bandwidth greater than the first bandwidth by a factor of at least ten when the third and fourth current sources are on.

14. The PLL of claim 13 wherein:

the gain of the first and second current sources is variable when the first and second current sources are on; and the gain of the third and fourth current sources is constant when the third and fourth current sources are on.

15. The PLL of claim 9 wherein:

a magnitude of a current from the second current source divided by a magnitude of a current from the first current source approximately equals a predetermined number; and a magnitude of a current from the fourth current source divided by a magnitude of a current from the third current source approximately equals the predetermined number.

16. The PLL of claim 15 wherein:

the predetermined number is approximately 3.2.

17. The PLL of claim 15 wherein:

the magnitude of the current from the first current source is variable by a factor of four when the first current source is on; and the magnitude of the current from the second current source is variable by a factor of four when the second current source is on.

18. The PLL of claim 17 wherein:

the magnitude of the current from the third current source is constant when the third current source is on; and the magnitude of the current from the fourth current source is constant when the fourth current source is on.

19. The PLL of claim 9 wherein:

the dual-state charge pump comprises:
a sensor circuit to measure a magnitude of a current of the third current source; and the dual-state charge pump turns on the first and second current sources after the sensor circuit measures the magnitude of the current of the third current source to be below a predetermined level.

20. A method of operating a phase lock loop (PLL) comprising the steps of:

receiving a reference frequency signal;

receiving a feedback frequency signal;

comparing phase of the feedback frequency signal to a phase of the reference frequency signal;

turning on a first set of current sources in a charge pump if the phase of the feedback frequency signal is within a predetermined range of the phase of the reference frequency signal plus a predetermined phase offset, the first set of current sources generating a first current having a first magnitude;

turning on a second set of current sources in the charge pump for a predetermined period of time if the phase of the feedback frequency signal is outside of a predetermined range of the phase of the reference frequency signal plus the predetermined phase offset, the second set of current sources generating a second current having a second magnitude; and if the second set of current sources is turned on, turning on the first set of current sources after the predetermined period of time;

wherein turning on the second set of current sources reduces a phase lock time of the PLL compared to when the first set of current sources is turned on.

21. The method of claim 20 further comprising:

starting the predetermined period of time at a beginning of the step of turning on the second set of current sources.

22. The method of claim 21 further comprising:

providing two milliseconds for the predetermined period of time.

23. The method of claim 20 further comprising:

turning on the second set of current sources at an end of the predetermined period of time.

24. The method of claim 20 wherein:

turning on the first set of current sources comprises:
using first and second current sources coupled together in series; and turning on the second set of current sources comprises:
using third and fourth current sources coupled together in series.

25. The method of claim 24 wherein:

turning on the first set of current sources further comprises:
varying a magnitude of a current from the first set of current sources; and turning on the second set of current sources further comprises:
keeping a magnitude of a current from the second set of current sources constant.

* * * * *